US011647655B2

United States Patent
Yun et al.

(10) Patent No.: US 11,647,655 B2
(45) Date of Patent: May 9, 2023

(54) DISPLAY DEVICE INCLUDING A CONDUCTIVE LINE DISPOSED ON AN INSULATING LAYER GROOVE AND A METHOD OF MANUFACTURING THE SAME

(71) Applicant: SAMSUNG DISPLAY CO., LTD., Yongin-si (KR)

(72) Inventors: Jong Hyun Yun, Suwon-si (KR); Jun Young Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 232 days.

(21) Appl. No.: 16/939,511

(22) Filed: Jul. 27, 2020

(65) Prior Publication Data

US 2021/0083035 A1  Mar. 18, 2021

(30) Foreign Application Priority Data

Sep. 18, 2019  (KR) .......................... 10-2019-0114754

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01)

(58) Field of Classification Search
CPC ........................... H01L 27/3276; H01L 51/56
See application file for complete search history.

(56) References Cited

U.S. PATENT DOCUMENTS

| 2006/0113671 | A1* | 6/2006 | Isa | H01L 23/5329 257/E21.585 |
|---|---|---|---|---|
| 2011/0237066 | A1* | 9/2011 | Sato | H01L 23/53295 156/345.24 |
| 2011/0254165 | A1* | 10/2011 | Muranaka | H01L 23/53295 257/E23.161 |
| 2015/0357293 | A1* | 12/2015 | Tomita | H01L 23/585 257/629 |
| 2017/0084542 | A1* | 3/2017 | Kato | H01L 21/76811 |
| 2017/0141169 | A1* | 5/2017 | Sim | H01L 27/3258 |
| 2020/0259055 | A1* | 8/2020 | Iguchi | G09F 9/30 |
| 2020/0388567 | A1* | 12/2020 | Mignot | H01L 21/31116 |

FOREIGN PATENT DOCUMENTS

| KR | 10-2006-0110200 | 10/2006 |
|---|---|---|
| KR | 10-2011-0023138 | 3/2011 |
| KR | 10-2012-0842151 | 5/2012 |
| KR | 10-2017-0131762 | 11/2017 |
| KR | 10-2018-0125061 | 11/2018 |

* cited by examiner

Primary Examiner — Douglas M Menz

(74) Attorney, Agent, or Firm — F. Chau & Associates, LLC

(57) ABSTRACT

A display device is provided including a first conductive line disposed on a substrate. A first insulating layer is disposed on the substrate at least partially covering the first conductive line. The first insulating layer has a contact hole, which exposes the first conductive line, and a groove recessed in a direction towards the substrate. The groove has a depth smaller than a depth of the contact hole. A second conductive line is disposed in the groove on the first insulating layer and is connected to the first conductive line through the contact hole.

13 Claims, 11 Drawing Sheets

FIG. 8
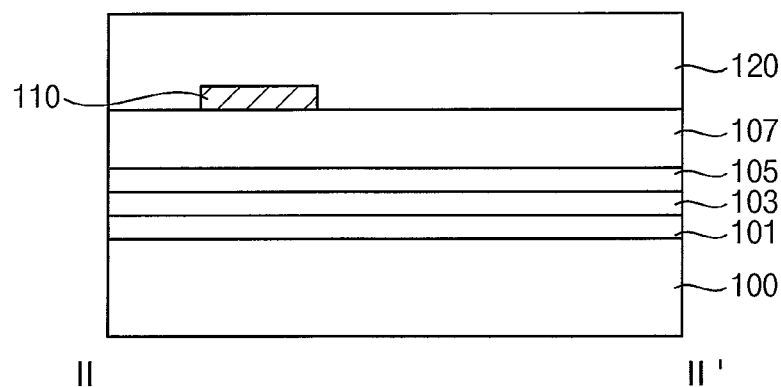
FIG. 9
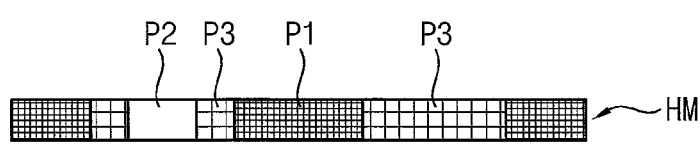
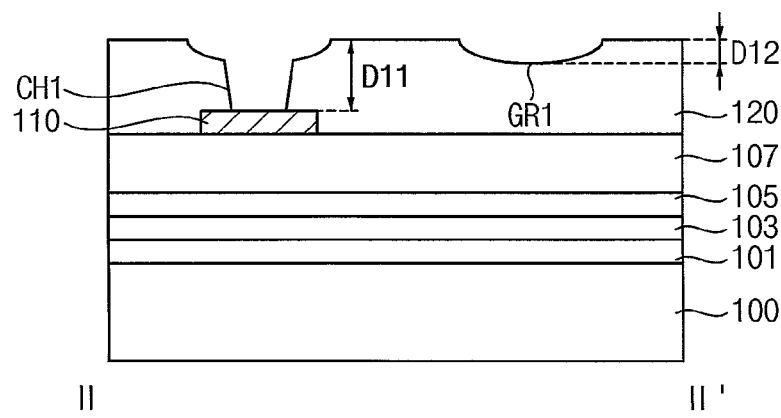

DISPLAY DEVICE INCLUDING A CONDUCTIVE LINE DISPOSED ON AN INSULATING LAYER GROOVE AND A METHOD OF MANUFACTURING THE SAME

CROSS-REFERENCE TO RELATED APPLICATION

This application claims priority under 35 U.S.C. § 119 to Korean Patent Application No. 10-2019-0114754, filed on Sep. 18, 2019 in the Korean Intellectual Property Office (KIPO), the disclosure of which is incorporated by reference herein in its entirety.

TECHNICAL FIELD

Exemplary Embodiments of the present invention relate to a display device, and more particularly, a display device including a conductive line disposed on an insulating layer groove and a method of manufacturing the same.

DISCUSSION OF THE RELATED ART

An organic light emitting diode display device is a self-emission display device for displaying an image by using an organic light emitting diode (OLED) that emits light. Such an organic light emitting diode display device has high quality characteristics such as low power consumption, high luminance, and a high response speed. Therefore, the organic light emitting diode display device is spotlighted as a next-generation display device. The organic light emitting diode may include a pixel electrode, a light emitting layer, and a counter electrode which are sequentially disposed on a substrate.

A conductive line for transmitting a signal, a voltage, and the like may be disposed under the organic light emitting diode. A protrusion may be formed on a portion of the pixel electrode that is at least partially overlapped by the conductive line due to a step difference caused by the conductive line. In such a case when the pixel electrode is not flat, the protrusion of the pixel electrode may be visible when the organic light emitting diode display device does not display the image, and color deviation may occur depending on a viewing direction when the organic light emitting diode display device displays the image.

SUMMARY

According to an exemplary embodiment of the present invention, a display device is provided including a first conductive line disposed on a substrate. A first insulating layer is disposed on the substrate at least partially covering the first conductive line. The first insulating layer has a contact hole, which exposes the first conductive line, and a groove recessed in a direction towards the substrate. The groove has a depth smaller than a depth of the contact hole. A second conductive line is disposed in the groove on the first insulating layer and is connected to the first conductive line through the contact hole.

According to an exemplary embodiment of the present invention, a second insulating layer is disposed on the first insulating layer at least partially covering the second conductive line, and the groove has a round shape recessed in the direction towards the substrate.

According to an exemplary embodiment of the present invention, the second conductive line has a 'U' shape.

According to an exemplary embodiment of the present invention, the groove has a rectangular shape recessed in the direction towards the substrate.

According to an exemplary embodiment of the present invention, the second conductive line has a flat top surface.

According to an exemplary embodiment of the present invention, a maximum depth of the groove is substantially equal to a thickness of the second conductive line.

According to an exemplary embodiment of the present invention, the first conductive line extends in a first direction and is configured to transmit a data signal.

According to an exemplary embodiment of the present invention, the second conductive line extends in the first direction and a second direction intersecting the first direction. The second conductive line connects a pad to the first conductive line.

According to an exemplary embodiment of the present invention, the first insulating layer includes an organic insulating material and an inorganic insulating material.

According to an exemplary embodiment of the present invention, the second insulating layer includes an organic insulating material.

According to an exemplary embodiment of the present invention, a pixel electrode is disposed on the second insulating layer at least partially overlapping the second conductive line. A light emitting layer is disposed on the pixel electrode, and a counter electrode is disposed on the light emitting layer.

According to an exemplary embodiment of the present invention, the pixel electrode is a reflective electrode, and the counter electrode is a transmissive electrode.

According to an exemplary embodiment of the present invention, a method of manufacturing a display device is provided including forming a first conductive line on a substrate. A first insulating layer is formed at least partially covering the first conductive line. A contact hole is formed exposing the first conductive line in the first insulating layer by using a halftone mask. A groove is formed in the first insulating layer by using the halftone mask. The groove is recessed in a direction towards the substrate and has a depth smaller than a depth of the contact hole. A second conductive line is formed at least partially filling the contact hole and the groove.

According to an exemplary embodiment of the present invention, a second insulating layer is formed at least partially covering the second conductive line. The first insulating layer includes an organic insulating material.

According to an exemplary embodiment of the present invention, the groove is formed by isotropically etching the first insulating layer.

According to an exemplary embodiment of the present invention, the groove has a round shape recessed in the direction towards the substrate.

According to an exemplary embodiment of the present invention, a method of manufacturing a display device is provided including forming a first conductive line on a substrate. A first insulating layer is formed at least partially covering the first conductive line. A contact hole is formed exposing the first conductive line in the first insulating layer by using a first mask. A groove is formed in the first insulating layer by using a second mask. The groove is recessed in a direction towards the substrate and has a depth smaller than a depth of the contact hole. A second conductive line is formed at least partially filling the contact hole and the groove. A second insulating layer is formed at least partially covering the second conductive line.

According to an exemplary embodiment of the present invention, the first insulating layer includes an organic insulating material and an inorganic insulating material.

According to an exemplary embodiment of the present invention, the groove is formed by anisotropically etching the first insulating layer.

According to an exemplary embodiment of the present invention, the groove has a rectangular shape recessed in the direction towards the substrate.

BRIEF DESCRIPTION OF THE DRAWINGS

Exemplary embodiments of the present invention will be more clearly understood from the following Detailed Description taken in conjunction with the accompanying drawings, in which:

FIGS. 8, 9, 10, and 11 are cross-sectional views illustrating steps in a method of manufacturing the display device of FIG. 7, according to an exemplary embodiment of the present invention;

DETAILED DESCRIPTION OF THE EXEMPLARY EMBODIMENTS

Hereinafter, the present invention will be described more fully with reference to the accompanying drawings in which exemplary embodiments of the present invention are shown.

Figure 1:
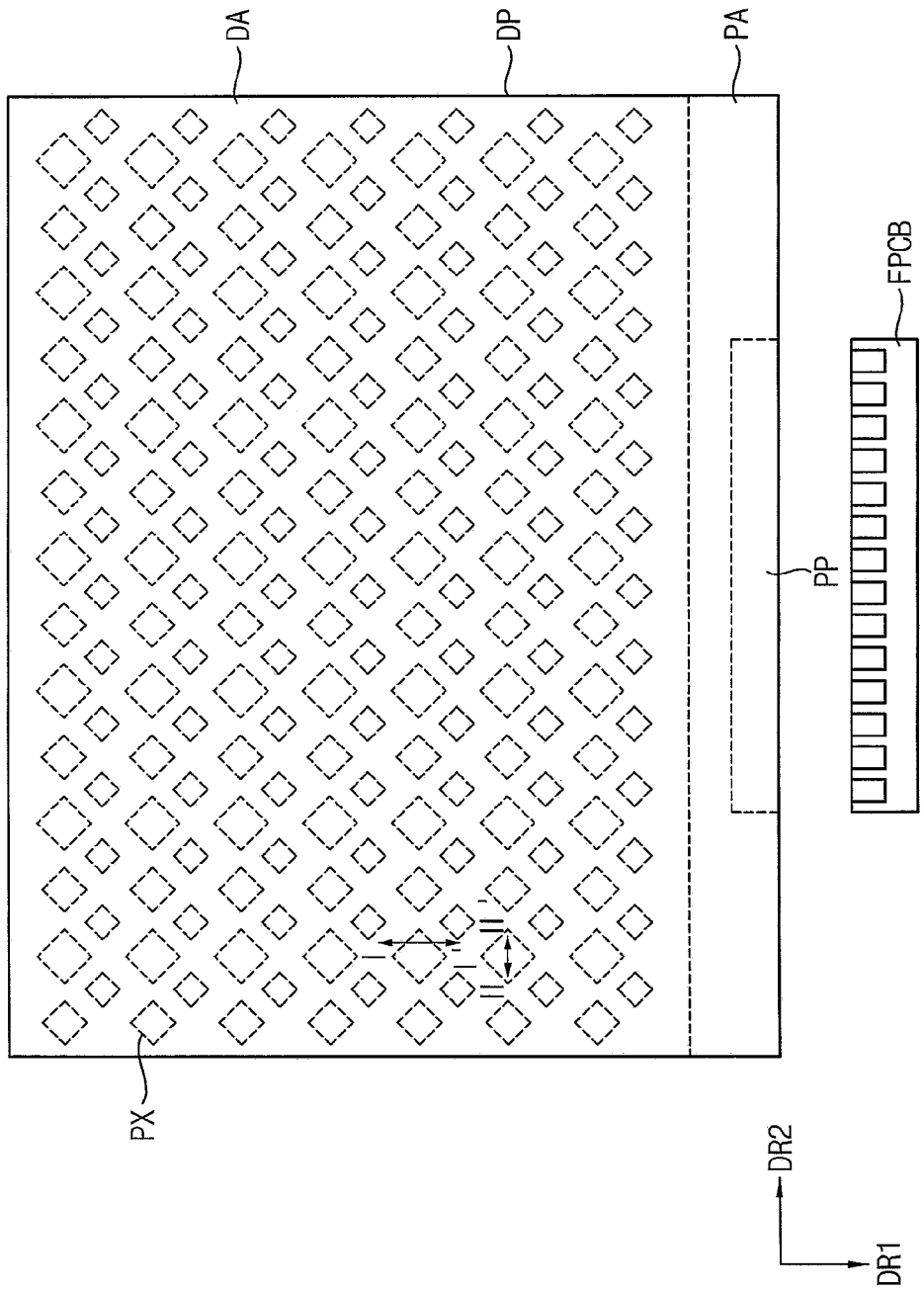
FIG. 1 is a plan view illustrating a display device, according to an exemplary embodiment of the present invention.

FIG. 1 is a plan view illustrating a display device, according to an exemplary embodiment of the present invention.

Referring to FIG. 1, a display device according to an exemplary embodiment of the present invention may include a display panel DP and a flexible printed circuit board FPCB. The display panel DP may include a display area DA and a peripheral area PA.

A plurality of pixels PX may be disposed in the display area DA. The pixels PX may be arranged in a matrix form along a first direction e.g., a DR1 direction) and a second direction (e.g., a DR2 direction) intersecting the first direction (e.g., the DR1 direction).

The peripheral area PA may be disposed on at least one side of the display area DA. For example, the peripheral area PA may extend in the first direction (e.g., the DR1 direction) from a side of the display area DA. A pad part PP may be disposed in the peripheral area PA. The pad part PP may be located at a center of the peripheral area PA in the second direction (e.g., the DR2 direction). For example, the pad part PP may have opposite, parallel short sides disposed at equidistant distances in the second direction (e.g., the DR2 direction) from respective short sides of the peripheral area PA that extend in the first direction (e.g., the DR1 direction). For example, the pad part PP might not be located at a periphery of the peripheral area PA in the second direction (e.g., the DR2 direction). A plurality of pads may be disposed in the pad part PP. The flexible printed circuit board FPCB may be connected to the pad part PP, and signals may be provided to the pads from an external device through the flexible printed circuit board. FPCB.

Figure 2:
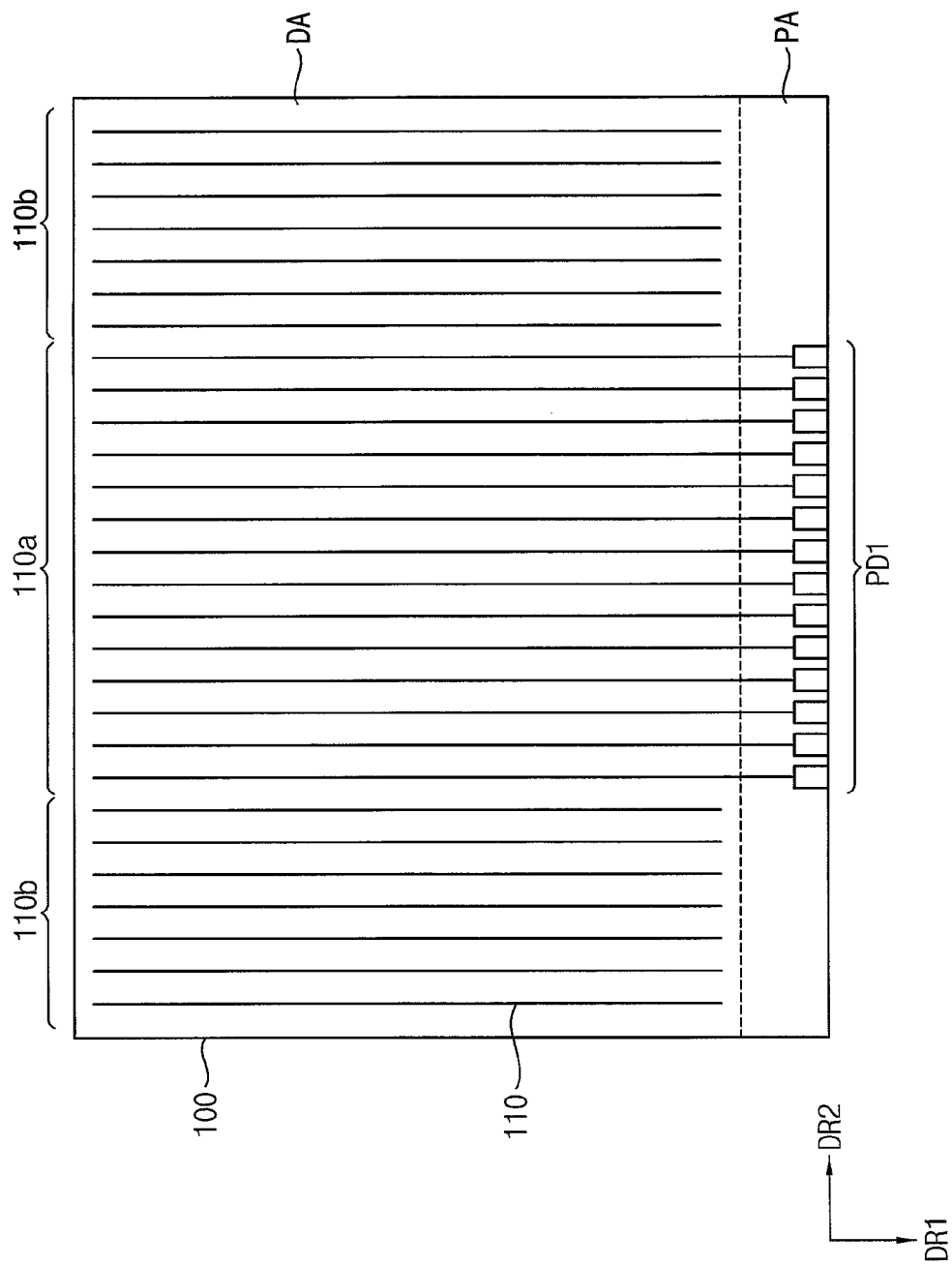
FIG. 2 is a plan view illustrating first conductive lines included in the display device of FIG. 1, according to an exemplary embodiment of the present invention.

FIG. 2 is a plan view illustrating first conductive lines included in the display device of FIG. 1, according to an exemplary embodiment of the present invention.

Referring to FIGS. 1 and 2, a plurality of first conductive lines 110 may be disposed on a substrate 100. The first conductive lines 110 may transmit data signals to the pixels PX. The first conductive lines 110 may extend in the first direction (e.g., the DR1 direction), and may be arranged along the second direction (e.g., the DR2 direction). The first conductive lines 110 may be respectively connected to pixel columns which are arranged along the second direction (e.g., the DR2 direction).

Some of the first conductive lines 110a located at a center of the display area DA in the second direction (e.g., the DR2 direction) among the first conductive lines 110 may be connected to first pads PD1. The first pads PD1 may be connected to the flexible printed circuit board FPCB, and the data signals may be applied to the first pads PD1 from the flexible printed circuit board FPCB. The first pads PD1 may be disposed on the same layer as the first conductive lines 110, or the first pads PD1 and the first conductive lines 110 may be disposed on different layers from one another.

Figure 3:
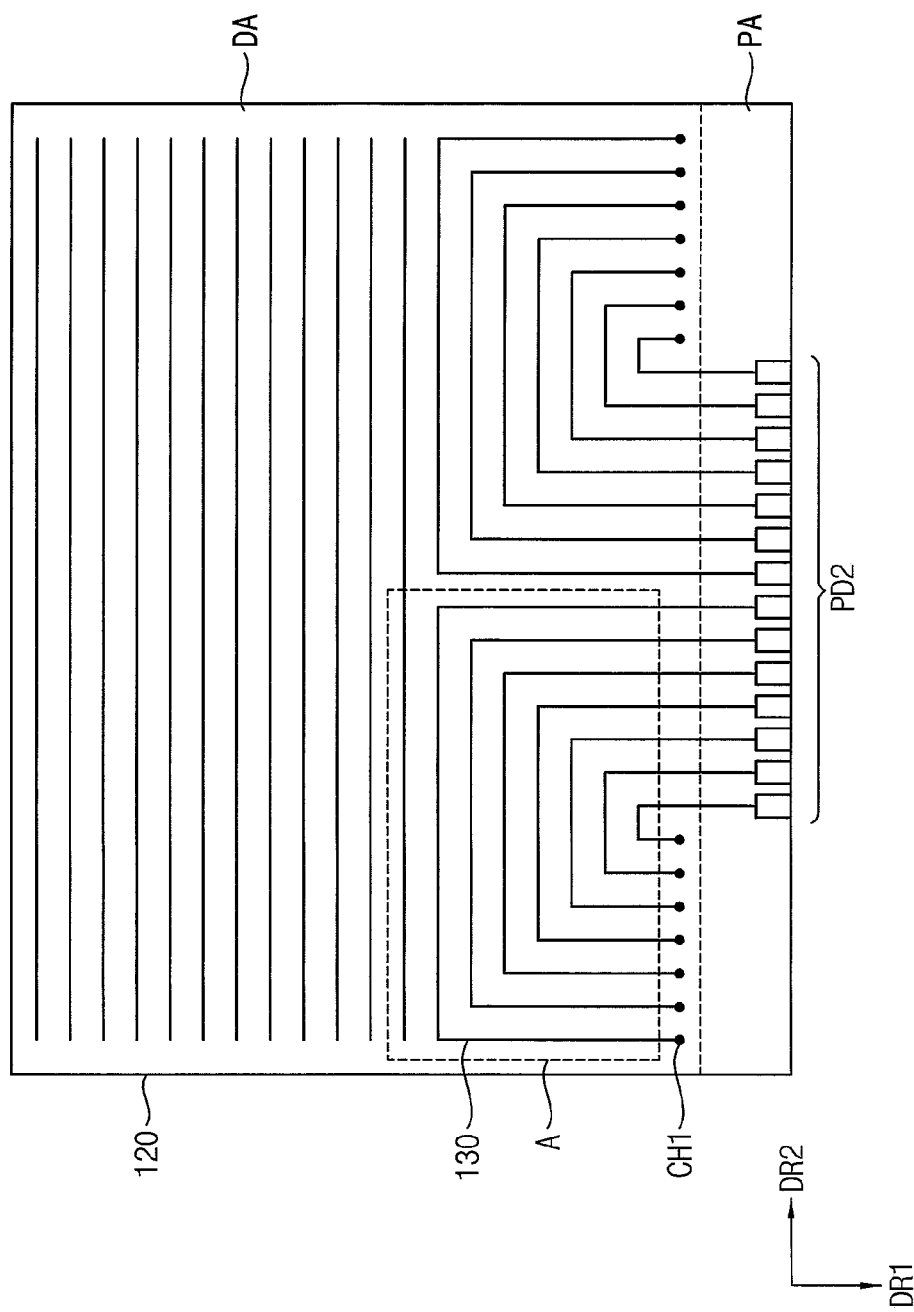
FIG. 3 is a plan view illustrating second conductive lines included in the display device of FIG. 1, according to an exemplary embodiment of the present invention.

FIG. 3 is a plan view illustrating second conductive lines included in the display device of FIG. 1, according to an exemplary embodiment of the present invention.

Referring to FIGS. 1, 2, and 3, a first insulating layer 120, which at least partially covers the first conductive lines 110, may be disposed on the substrate 100. A plurality of second conductive lines 130 may be disposed on the first insulating layer 120. The second conductive lines 130 may connect at least one of the first conductive lines 110b, which are located at edge portions of the display area DA in the second direction (e.g., the DR2 direction) among the first conductive lines 110, to second pads PD2. The second pads PD2 may at least partially overlap the first pads PD1 in a thickness direction e.g., a direction perpendicular to an upper surface of the substrate 100). The second pads PD2 may be connected to the flexible printed circuit board FPCB, and the data signals may be applied to the second pads PD2 from the flexible printed circuit board FPCB. The second pads PD2 may be disposed on the same layer as the second conductive lines 130, or the second pads PD2 and the second conductive lines 130 may be disposed on different layers from one another.

At least one of the second conductive lines 130 disposed adjacent to the peripheral area PA may extend in at least two directions. The second conductive lines 130 disposed adjacent to the peripheral area PA may connect at least one of the first conductive lines 110b, which are located at the periphery of edge portions of the display area DA spaced in the second direction (e.g., the DR2 direction), to the second pads PD2. In an exemplary embodiment of the present invention, the second conductive lines 130 may extend in the first direction (e.g., the DR1 direction) and the second direction (e.g., the DR2 direction).

Contact holes CH1 may be formed in the first insulating layer 120. For example, the contact holes CH1 may be formed at a periphery of edge portions of the display area DA spaced apart in the second direction (e.g., the DR2 direction) and may connect to the first conductive lines 110b. The second conductive lines 130 and end portions of some of the first conductive lines 110b, which are located at the periphery of edge portions of the display area DA spaced in the second direction (e.g., the DR2 direction), may be connected to each other through the contact holes CH1.

Figure 4:
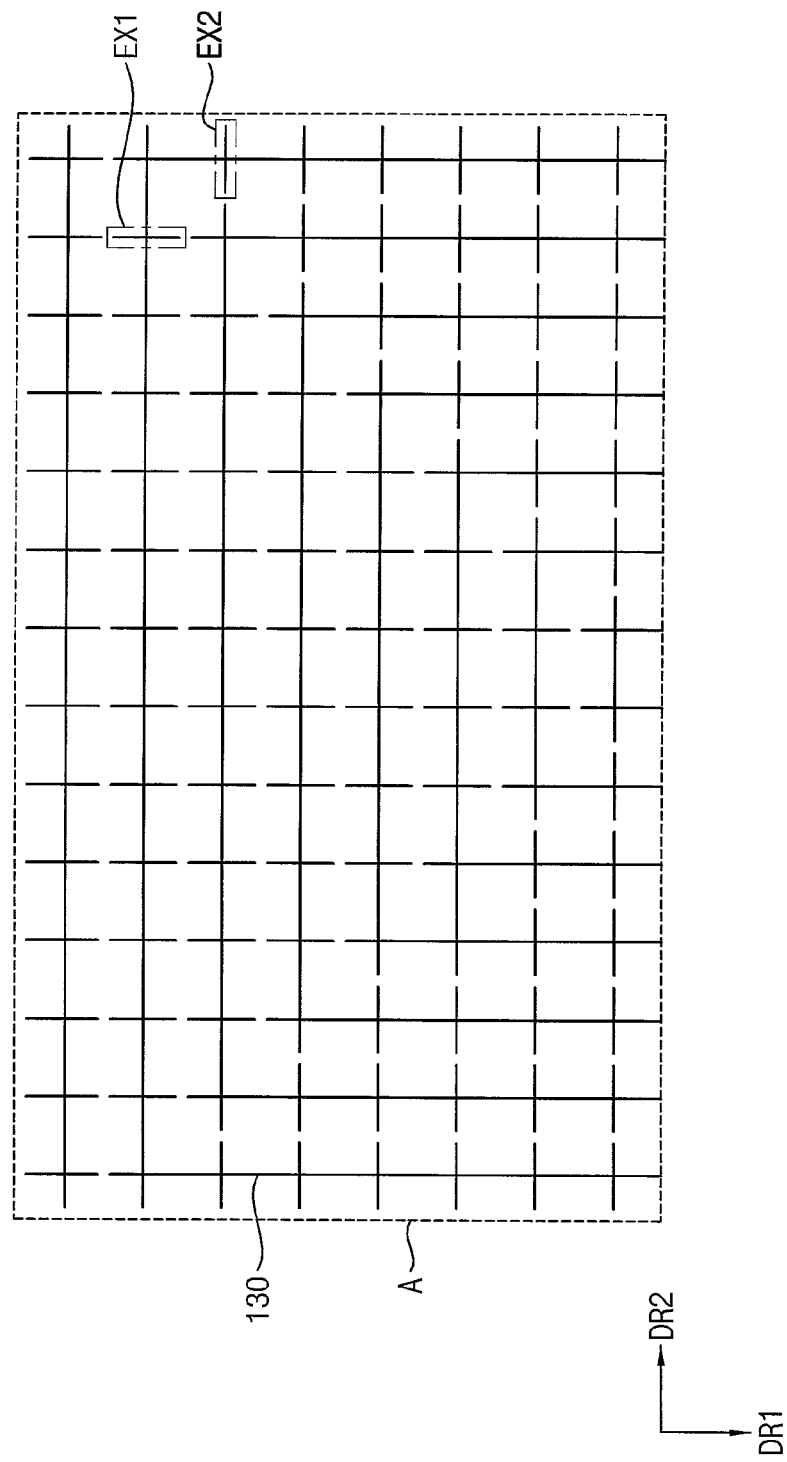
FIG. 4 is a plan view illustrating an enlarged region A of FIG. 3 including the second conductive lines, according to an exemplary embodiment of the present invention.

FIG. 4 is a plan view illustrating region A of FIG. 3 including the the second conductive lines 130, according to an exemplary embodiment of the present invention.

Referring to FIG. 4, the second conductive lines 130 may include first extension parts EX1 and second extension parts EX2. Each of the first extension parts EX1 may extend in the first direction (e.g., the DR1 direction), and the first extension parts EX1 may be arranged along the second direction (e.g., the DR2 direction). Each of the second extension parts EX2 may extend in the second direction (e.g., the DR2 direction), and the second extension parts EX2 may be arranged along the first direction (e.g., the DR1 direction). The first extension part EX1 and the second extension part EX2 that intersect each other may form a cross shape.

The first extension parts EX1 adjacent to each other in the first direction (e.g., the DR1 direction) may be connected to each other to form a vertical wire extending in the first direction (e.g., the DR1 direction), and the second extension pans EX2 adjacent to each other in the second direction (e.g., the DR2 direction) may be connected to each other to form a horizontal wire extending in the second direction (e.g., the DR2 direction). The vertical wire and the horizontal wire may be connected to each other to form the second conductive line 130.

The first extension part EX1 and the second extension part EX2 that intersect each other to form a cross shape are uniformly arranged along the first direction (e.g., the DR1 direction) and the second direction (e.g., the DR2 direction) so that, in a case in which the display device does not display an image, visibility of the display device may be prevented from being decreased, or the decrease of the visibility of the display device may be minimized, even if the second conductive line 130 is visible.

Figure 5:
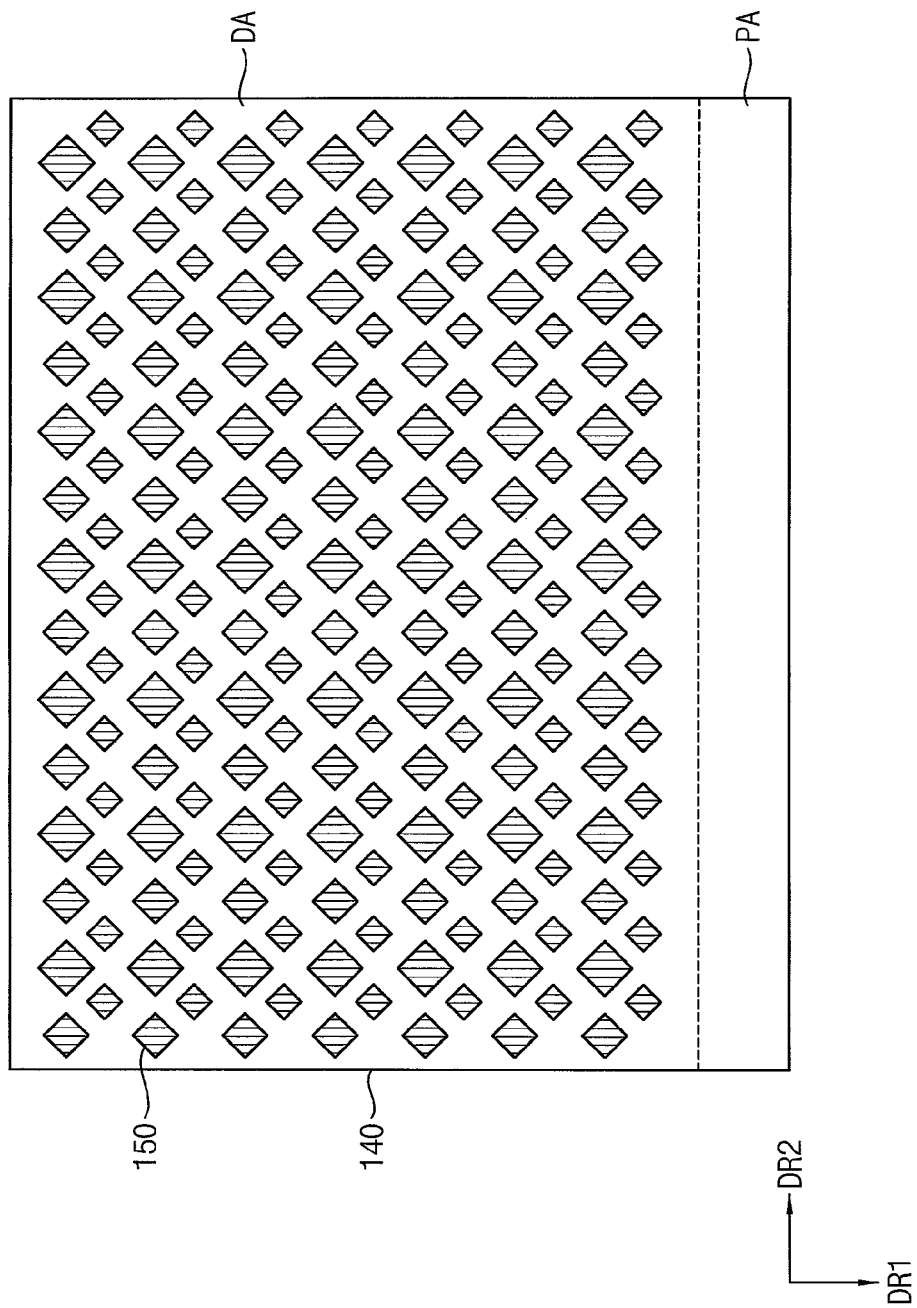
FIG. 5 is a plan view illustrating pixel electrodes included in the display device of FIG. 1, according to an exemplary embodiment of the present invention.

FIG. 5 is a plan view illustrating pixel electrodes included in the display device of FIG. 1, according to an exemplary embodiment of the present invention.

According to an exemplary embodiment of the present invention, adjacent columns of pixels PX might not have the same size.

Referring to FIGS. 1, 3, and 5, a second insulating layer 140 which at least partially covers the second conductive lines 130 may be disposed on the first insulating layer 120, and a plurality of pixel electrodes 150 may be disposed in the display area DA on the second insulating layer 140. The pixel electrodes 150 may be arranged substantially in a matrix form along the first direction (e.g., the DR1 direction) and the second direction (e.g., the DR2 direction). The pixels PX may be defined in an area in which the pixel electrodes 150 are disposed in the display area DA.

Figure 6:
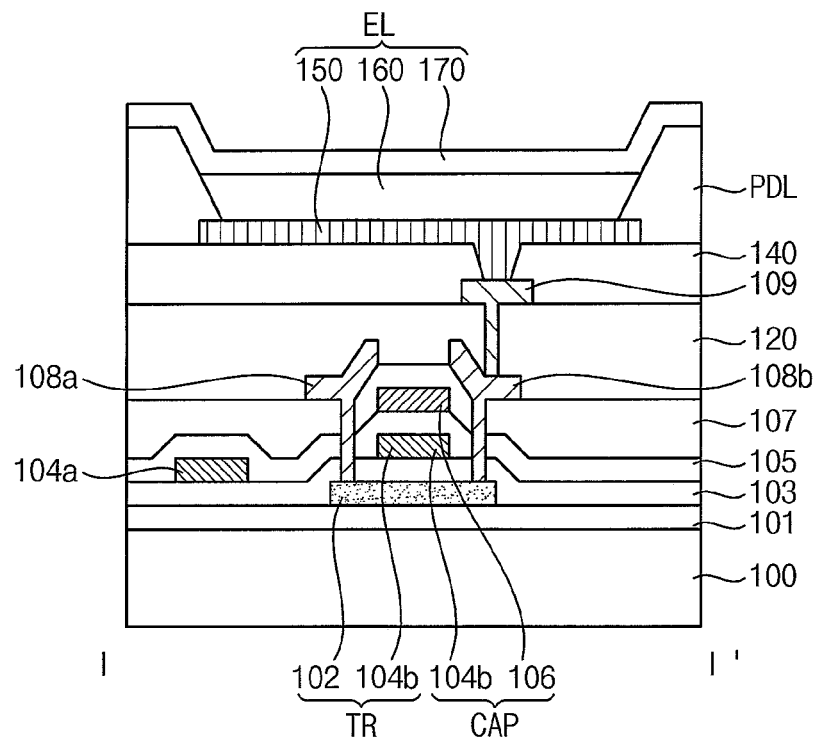
FIG. 6 is a cross-sectional view illustrating a cross-section of the display device taken along line I-I' of FIG. 1, according to an exemplary embodiment of the present invention.

FIG. 6 is a cross-sectional view illustrating the display device taken along line I-I' of FIG. 1, according to an exemplary embodiment of the present invention. Line I-I' of FIG. 1 might not intersect the first conductive line 110 and the second conductive line 130.

A buffer layer 101 may be disposed on the substrate 100. The substrate 100 may be an insulating substrate including glass, quartz and/or plastic.

The buffer layer 101 may prevent impurities such as oxygen and moisture from being diffused to an upper portion of the substrate 100. In addition, the buffer layer 101 may provide a flat top surface on the upper portion of the substrate 100. The buffer layer 101 may include an inorganic insulating material such as silicon oxide, silicon nitride, and/or silicon oxynitride. In an exemplary embodiment of the present invention, the buffer layer 101 might not be provided.

An active layer 102 may be disposed on the buffer layer 101. The active layer 102 may be entirely overlapped by the pixel electrode 150 and may be narrower than the pixel electrode. The active layer 102 may be formed of amorphous silicon, polycrystalline silicon and/or an oxide semiconductor. The active layer 102 may include a source, region, a drain region, and a channel region disposed between the source region and the drain region. The source region and the drain region may be doped with P-type or N-type impurities.

A gate insulating layer 103 which at least partially covers the active layer 102 may be disposed on the buffer layer 101. The gate insulating layer 103 may insulate a gate electrode 104b disposed on the active layer 102 from the active layer 102. The gate insulating layer 103 may include an inorganic insulating material such as silicon oxide, silicon nitride and/or silicon oxynitride.

A gate line 104a and the gate electrode 104b may be disposed on the gate insulating layer 103. The active layer 102 may at least partially overlap the gate line 104a. The gate line 104a may extend in the second direction the DR2 direction) intersecting the first conductive line 110. The gate line 104a may transmit a gate signal to the pixel PX. The gate electrode 104b may at least partially overlap the channel region of the active layer 102. The gate line 104a and the gate electrode 104b may include a conductive material such as molybdenum (Mo) and/or copper (Cu). The active layer 102, which includes the source region, the drain region, and the channel region, and the gate electrode 104b may form a transistor TR.

A first interlayer insulating layer 105 which at least partially covers the gate line 104a and the gate electrode 104b may be disposed on the gate insulating layer 103. The first interlayer insulating layer 105 may insulate a capacitor electrode 106 disposed on the gate electrode 104b from the gate electrode 104b. In an exemplary embodiment of the present invention, the first interlayer insulating layer 105 may include an inorganic insulating material such as silicon oxide, silicon, nitride and/or silicon oxynitride.

The capacitor electrode 106 may be disposed on the first interlayer insulating layer 105. The capacitor electrode 106 may at least partially overlap the gate electrode 104b. The capacitor electrode 106 and the gate electrode 104b may be substantially a same width. The capacitor electrode 106 may include a conductive material such as molybdenum (Mo) and/or copper (Cu). The gate electrode 104b and the capacitor electrode 106 may form a capacitor CAP. The capacitor CAP may be disposed between the source electrode 108a and the drain electrode 108b.

A second interlayer insulating layer 107 which at least partially covers the capacitor electrode 106 may be disposed on the first interlayer insulating layer 105. The second interlayer insulating layer 107 may insulate a source electrode 108a and a drain electrode 108b disposed on the capacitor electrode 106 from the capacitor electrode 106. In an exemplary embodiment of the present invention, the second interlayer insulating layer 107 may include an inorganic insulating material such as silicon oxide, silicon nitride and/or silicon oxynitride.

The source electrode 108a and the drain electrode 108b may be disposed on the second interlayer insulating layer 107. The source electrode 108a and the drain electrode 108b may be connected to the source region and the drain region of the active layer 102, respectively. For example, the source electrode 108a and the drain electrode 108b may respectively make contact with the source region and the drain region of the active layer 102 through contact holes formed in the gate insulating layer 103, the first interlayer insulating layer 105, and the second interlayer insulating layer 107. The source electrode 108a and the drain electrode 108b may include a conductive material such as aluminum (Al), titanium (Ti) and/or copper (Cu).

The first insulating layer 120 which at least partially covers the source electrode 108a and the drain electrode 108b may be disposed on the second interlayer insulating layer 107.

A connection electrode 109 may be disposed on the first insulating layer 120. The connection electrode 109 may be connected to the drain electrode 108b. For example, the connection electrode 109 may make contact with the drain electrode 108b through the contact hole formed in the first insulating layer 120. The connection electrode 109 may include a conductive material such as aluminum (Al), titanium (Ti) and/or copper (Cu).

The second insulating layer 140 which at least partially covers the connection electrode 109 may be disposed on the first insulating layer 120.

A pixel electrode 150 may be disposed on the second insulating layer 140. The pixel electrode 150 may be connected to the connection electrode 109. For example, the pixel electrode 150 may make contact with the connection electrode 109 through a contact hole formed in the second insulating layer 140.

A pixel defining layer PDL which at least partially covers the pixel electrode 150 may be disposed on the second insulating layer 140. The pixel defining layer PDL may have a pixel opening that exposes at least a portion of the pixel electrode 150. In an exemplary embodiment of the present invention, the pixel opening may expose a central portion of the pixel electrode 150, and the pixel defining layer PDL may at least partially cover a peripheral portion of the pixel electrode 150. The pixel defining layer PDL may include an organic insulating material such as polyimide (PI).

A light emitting layer 160 may be disposed on the pixel electrode 150. The light emitting layer 160 may be disposed on the pixel electrode 150 which is exposed by the pixel opening. The light emitting layer 160 may include at least one of an organic light emitting material and a quantum dot.

In an exemplary embodiment of the present invention, the organic light emitting material may include a low-molecular-weight organic compound and/or a high-molecular-weight organic compound. For example, the low-molecular-weight organic compound may include copper phthalocyanine, N,N'-diphenylbenzidine and/or tris-(8-hydroxyquinoline) aluminum, and the high-molecular-weight organic compound may include poly(3,4-ethylenedioxythiophene), polyaniline, poly-phenylenevinylene and/or polyfluorene.

In an exemplary embodiment of the present invention, the quantum dot may include a core including a Group II-VI compound, a Group III-V compound, a Group IV-VI compound, a Group IV element, a Group IV compound, and combinations thereof. In an exemplary embodiment of the present invention, the quantum dot may have a core-shell structure including a core and a shell surrounding the core. The shell may serve as a protective layer for preventing the core from being chemically denatured to maintain semiconductor characteristics, and may serve as a charging layer for imparting electrophoretic characteristics to the quantum dot.

A counter electrode 170 may be disposed on the light emitting layer 160. In an exemplary embodiment of the present invention, the counter electrode 170 may also be disposed on the pixel defining layer PDL and the pixel opening. The pixel electrode 150, the light emitting layer 160, and the counter electrode 170 may collectively form a light emitting element EL.

Figure 7:
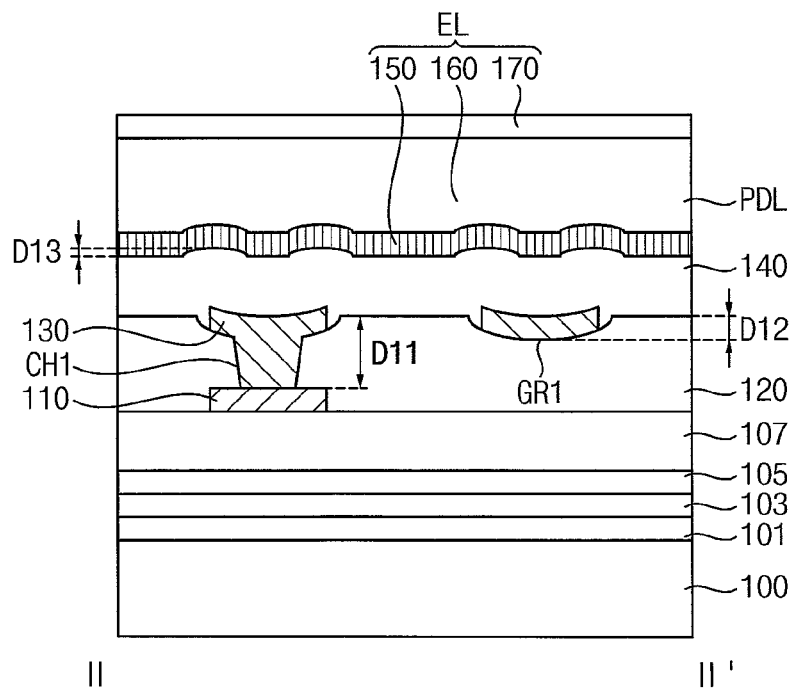
FIG. 7 is a cross-sectional view illustrating a cross-section of the display device taken along line II-II' of FIG. 1, according to an exemplary embodiment of the present invention.

FIG. 7 is a cross-sectional view illustrating a display device taken along line II-II' of FIG. 1, according to an exemplary embodiment of the present invention. Line II-II' of FIG. 1 may intersect the first conductive line 110 and the second conductive line 130.

Referring to FIGS. 6 and 7, the first conductive line 110 may be disposed on the second interlayer insulating layer 107. The first conductive line 110 may be disposed on substantially the same level (e.g., a same layer) as the source electrode 108a and the drain electrode 108b, and may include substantially the same material as the source electrode 108a and the chain electrode 108b.

The first insulating layer 120 which at least partially covers the first conductive line 110 may be disposed on the second interlayer insulating layer 107. In an exemplary embodiment of the present invention, the first insulating layer 120 may include an organic insulating material. For example, the first insulating layer 120 may include a photosensitive material such as a photoresist.

The first insulating layer 120 may have a contact hole CH1 and a groove GR1. The contact hole CH1 may expose the first conductive line 110. For example, the contact hole CH1 may expose a portion of a top surface of the first conductive line 110. In this case, the contact hole CH1 may have a depth D11 corresponding to a distance from the top surface of the first conductive line 110 to a top surface of the first insulating layer 120.

The groove GR1 may be recessed in a direction towards the substrate 100, and may have a depth smaller than the depth D11 of the contact hole CH1. For example, lateral surfaces of the groove GR1 may be sloped towards a lowermost point of the groove GR1. The top surface of the first insulating layer 120 may be recessed in the direction towards the substrate 100 by the groove GR1 when viewed in a cross-sectional view. For example, the top surface of the first insulating layer 120 may have a semi-circular recess (e.g., concave), but the present invention is not limited thereto.

In an exemplary embodiment of the present invention, the groove GR1 may have a round shape recessed in the direction towards the substrate 100. The depth of the groove GR1 may be gradually increased from a periphery to a central portion of the groove GR1. In this case, the groove GR1 may have a maximum depth D12 at the central portion.

The second conductive line 130 may be disposed in the groove GR1 on the first insulating layer 120. The second conductive line 130 may be connected to the first conductive line 110 through the contact hole CH1. Accordingly, the data signal may be transmitted from the second conductive line 130 to the first conductive line 110.

The second conductive line 130 may have a shape that corresponds to a shape of the groove GR1. For example, the second conductive line 130 may have a 'U' shape when viewed in a cross-sectional view. In a plan view, the groove GR1 and the second conductive line 130 may have a capsule shape. The second conductive line 130 may be disposed in the groove GR1 on the first insulating layer 120, and the second conductive line 130 may be formed along a profile of the groove GR1. Accordingly, the second conductive line 130 may have an upright 'U' shape bent in the direction towards the substrate 100 along the profile of the groove GR1 which has a round shape recessed in the direction towards the substrate 100. However, the present invention is not limited thereto. For example, the groove GR1 may have an upside down 'U' shape in which downturned sides extend towards the substrate, and the second conductive line 130 disposed therein may have a corresponding shape.

In an exemplary embodiment of the present invention, the maximum depth D12 of the groove GR may be substantially equal to a thickness of the second conductive line 130. In this case, a height of a center of a top surface of the second conductive line 130 may be substantially equal to a height of the top surface of the first insulating layer 120.

The second insulating layer 140 which at least partially covers the second conductive line 130 may be disposed on the first insulating layer 120. The second insulating layer 140 may include an organic insulating material. For example, the second insulating layer 140 may include polyimide (PI) and the like.

A top surface of the second insulating layer 140 may be formed along profiles of the top surfaces of the first insulating layer 120 and the second conductive line 130 which are disposed under the second insulating layer 140. The second conductive line 130 is disposed in the groove GR1 of the first insulating layer 120 that is recessed in the direction towards the substrate 100, so that a thickness D13 of a first protrusion formed on the top surface of the second insulating layer 140 may be smaller than the thickness of the second conductive line 130. For example, the first protrusions at least partially overlapping upturned sides of the second conductive line 130 may have a maximum height from the upper surface of the second insulating layer 140 of thickness D13. Thickness D13 may be substantially equal to a difference between a maximum height of an upturned side of the second conductive line 130 and an upper surface of the first insulating layer 120.

The pixel electrode 150 may be disposed on the second insulating layer 140. The pixel electrode 150 may at least partially overlap the second conductive line 130.

A top surface of the pixel electrode 150 may be formed along a profile of the top surface of the second insulating layer 140, which is disposed under the pixel electrode 150. A second protrusion corresponding to the first protrusion formed on the top surface of the second insulating layer 140 may be formed on the top surface of the pixel electrode 150.

The light emitting layer 160 may be disposed on the pixel electrode 150, and the counter electrode 170 may be disposed on the light emitting layer 160. For example, the light emitting layer 160 may have a complimentary shape to a profile of the pixel electrode 150 including the first protrusions.

In an exemplary embodiment of the present invention, the pixel electrode 150 may be a reflective electrode, and the counter electrode 170 may be a transmissive electrode. For example, the pixel electrode 150 may be formed of a metal such as magnesium (Mg), silver (Ag), gold (Au), calcium (Ca), lithium (Li), chromium (Cr) and/or aluminum (Al), and may include at least one reflective film having a relatively large thickness and at least one transmissive film including transparent conductive oxide such as indium tin oxide (ITO), indium zinc oxide (IZO), zinc oxide (ZnO) and/or indium oxide ($In_2O_3$). In addition, the counter electrode 170 may be formed of a metal such as magnesium (Mg), silver (Ag), gold (Au), calcium (Ca), lithium (Li), chromium (Cr) and/or aluminum (Al), and may include a transflective film having a relatively small thickness or a transmissive film may including transparent conductive oxide such as indium tin oxide (ITO), indium zinc oxide (IZO), zinc oxide (ZnO) and/or indium oxide ($In_2O_3$).

When the display device does not display an image, a user looking at the display device from a top of the light emitting element EL in which the pixel electrode 150 is the reflective electrode and the counter electrode 170 is the transmissive electrode may recognize the protrusion of the pixel electrode 150. However, in exemplary embodiments of the present invention, the second conductive line 130 is disposed in the groove GR1 of the first insulating layer 120 that is recessed in the direction towards the substrate 100, so that the thickness of the second protrusion of the pixel electrode 150 may be reduced. Accordingly, the visibility of the display device mays be increased.

FIGS. 8, 9, 10, and 11 are cross-sectional views illustrating steps in a method of manufacturing the display device of FIG. 7 according to an exemplary embodiment of the present invention.

Referring to FIG. 8, the first conductive line 110 may be formed on the substrate 100, and the first insulating layer 120 which at least partially covers the first conductive line 110 may be formed on the substrate 100.

A buffer layer 101, a gate insulating layer 103, a first interlayer insulating layer 105, and a second interlayer insulating layer 107 may be sequentially disposed on the substrate 100.

The first conductive line 110 may be formed on the second interlayer insulating layer 107. For example, the first conductive layer may be formed by depositing a conductive material such as aluminum (Al), titanium (Ti) and/or copper (Cu) on the second interlayer insulating layer 107 by using physical vapor deposition. The physical vapor deposition may be performed by a process such as sputtering. The first conductive line 110 may be formed by etching the first conductive layer.

Next, the first insulating layer 120 which at least partially covers the first conductive line 110 may be formed on the second interlayer insulating layer 107. For example, the first insulating layer 120 may be formed by applying an organic insulating material such as a photoresist onto the second interlayer insulating layer 107 on which the first conductive line 110 is formed. The formation of the first insulating layer 120 may be performed by using a process such as spin coating and the like.

Referring to FIG. 9, the contact hole CH1 and the groove GR1 may be formed in the first insulating layer 120.

In an exemplary embodiment of the present invention, the contact hole CH1 and the groove GR1 may be formed by using a halftone mask HM. The halftone mask HM may include a light blocking part P1, light transmitting part P2, and a semi-light transmitting part P3. The light blocking part P1 may block light, and the light transmitting part P2 may transmit the light. The semi-light transmitting part P3 may block a portion of the light and transmit another portion of the light. For example, transmissivity of the semi-light transmitting part P3 may be greater than transmissivity of the light blocking part P1, and may be less than transmissivity of the light transmitting part P2.

First, the halftone mask HM may be disposed on the first insulating layer 120. The light transmitting part P2 may at least partially overlap an area in which the contact hole CH1 is formed, and the semi-light transmitting part P3 may at least partially overlap an area in which the groove GR1 is formed. Next, the contact hole CH1 and the groove GR1 may be formed at substantially the same time by exposing the first insulating layer 120 to light using the halftone mask HM, and developing the first insulating layer 120 exposed to the light.

In an exemplary embodiment of the present invention, the groove GR1 may be formed by isotropically etching the first insulating layer 120. The first insulating layer 120 may be isotropically etched in a process of developing a portion of the first insulating layer 120 exposed to the light by the semi-light transmitting part P3 of the halftone mask HM. In this case, the groove GR1 may have a round shape recessed in the direction towards the substrate 100.

Figure 10:
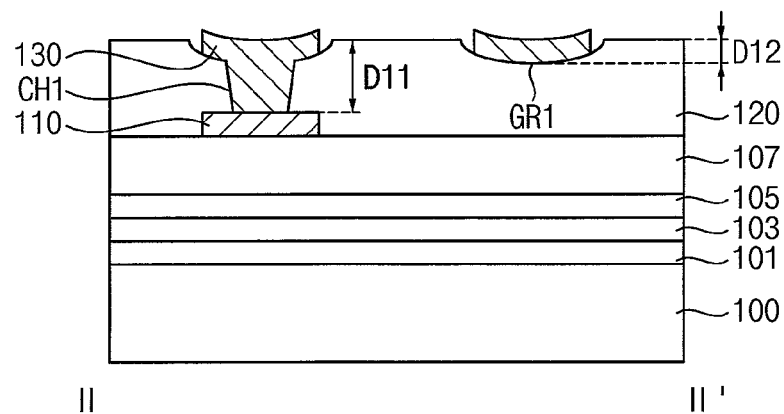

Referring to FIG. 10, the second conductive line 130 which fills the contact hole CH1 may be formed in the groove GR1 on the first insulating layer 120. For example, the second conductive layer may be formed by depositing a conductive material, such as aluminum (Al), titanium (Ti), and copper (Cu), on the first insulating layer 120 by using physical vapor deposition such as sputtering, and the second conductive line 130 may be formed by etching the second conductive layer.

The second conductive line 130 may be formed in the groove GR1 having a round shape recessed in the direction towards the substrate 100. Accordingly, the second conductive line 130 may have a 'U' shape when viewed in a cross-sectional view.

Figure 11:
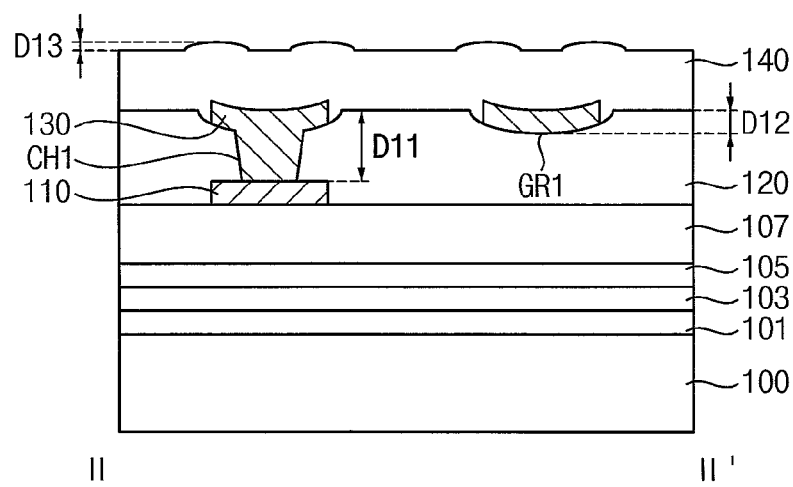

Referring to FIG. 11, the second insulating layer 140 which at least partially covers the second conductive line 130 may be formed on the first insulating layer 120. For example, the second insulating layer 140 may be formed by applying an organic insulating material such as polyimide (PI) onto the first insulating layer 120 on which the second conductive line 130 is formed. The formation of the second insulating layer 140 may be performed by using a process such as spin coating and the like.

In the present exemplary embodiment of the present invention, the contact hole CH1 and the groove GR1 are formed in the first insulating layer 120 at substantially the same time by using the halftone mask HM, so that an additional process for forming the groove GR1 may be omitted. Accordingly, a manufacturing cost and a manufacturing time for producing the display device may be reduced.

Figure 12:
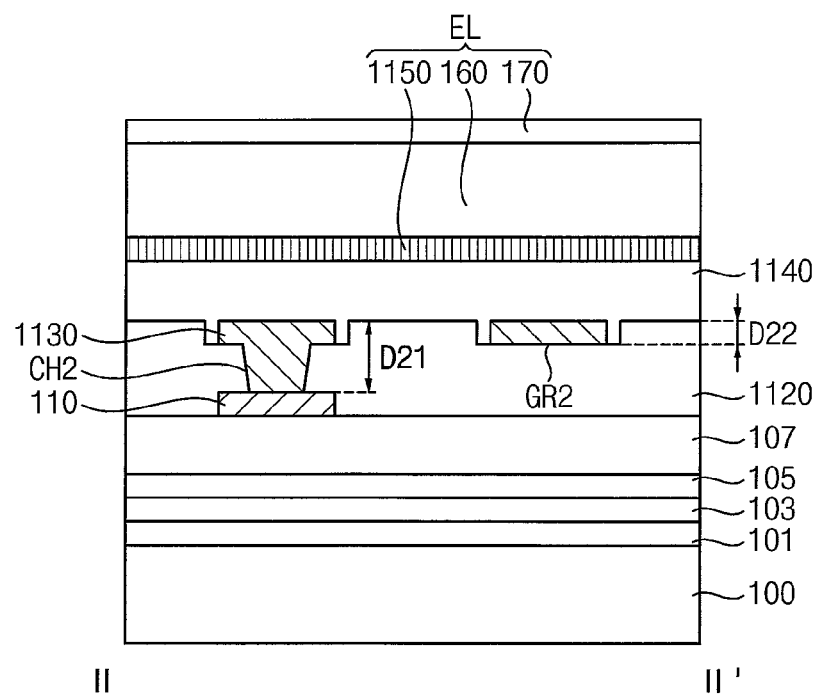
FIG. 12 is a cross-sectional view illustrating a cross-section of the display device taken along line II-II' of FIG. 1, according to an exemplary embodiment of the present invention.

FIG. 12 is a cross-sectional view illustrating the display device taken along line II-II' of FIG. 1, according to an exemplary embodiment of the present invention. In the exemplary embodiment of the display device, which will be described with reference to FIG. 12, descriptions of components substantially identical to previously designated components of the display device described with reference to FIG. 7 will be omitted.

Referring to FIG. 12, the first conductive line 110 may be disposed on the second interlayer insulating layer 107. A first insulating layer 1120 which at least partially covers the first conductive line 110 may be disposed on the second interlayer insulating layer 107.

In an exemplary embodiment of the present invention, the first insulating layer 1120 may include at least one of an organic insulating material and an inorganic insulating material. For example, the first insulating layer 1120 may include a photosensitive material, such as a photoresist and/or silicon oxide, silicon nitride and/or silicon oxynitride.

The first insulating layer 1120 may have a contact hole CH2 and a groove GR2. The contact hole CH2 may have a depth D21 corresponding to a distance from the top surface of the first conductive line 110 to a top surface of the first insulating layer 1120.

The groove GR2 may be recessed in the direction towards the substrate 100, and may have a depth D22 smaller than the depth D21 of the contact hole CH2. The top surface of the first insulating layer 1120 may be recessed in the direction towards the substrate 100 by the groove GR2 when viewed in a cross-sectional view.

In an exemplary embodiment of the present invention, the groove GR2 may have a rectangular shape recessed in the direction towards the substrate 100. For example, sides of the groove GR2 may be orthogonally connected in a plan view and/or cross-sectional view. The depth D22 of the groove GR2 may be substantially the same from a periphery to a central portion of the groove GR2. In this case, the depth D22 of the groove GR2 may be substantially uniform.

A second conductive line 1130 may be disposed in the groove GR2 on the first insulating layer 1120. The second conductive line 1130 may be connected to the first conductive line 110 through the contact hole CH2.

The second conductive line 1130 may have a flat top surface. The second conductive line 1130 may be disposed in the groove GR2 on the first insulating layer 1120, and the top surface of the second conductive line 1130 may be formed along a profile of the groove GR2. Accordingly, the second conductive line 1130 may have the flat top surface extending along the profile of the groove GR2, which has a rectangular shape recessed in the direction towards the substrate 100.

In an exemplary embodiment of the present invention, the depth D22 of the groove GR may be substantially equal to a thickness of the second conductive line 1130. In this case, a height of the top surface of the second conductive line 1130 may be substantially equal to a height of the top surface of the first insulating layer 1120 (e.g., coplanar therewith).

A second insulating layer 1140 which at least partially covers the second conductive line 1130 may be disposed on the first insulating layer 1120. The second insulating layer 1140 may include an organic insulating material.

A top surface of the second insulating layer 1140 may be formed along profiles of the top surfaces of the first insulating layer 1120 and the second conductive line 1130 which are disposed under the second insulating layer 1140. The second conductive line 1130 is disposed in the groove GR2 of the first insulating layer 1120 that is recessed in the direction towards the substrate 100, and the thickness of the second conductive line 1130 is substantially equal to the depth D22 of the groove GR2, so that a protrusion may not be formed on the top surface of the second insulating layer 1140. For example, the second insulating layer 1140 may have a flat top surface.

A pixel electrode 1150 may be disposed on the second insulating layer 1140. The pixel electrode 1150 may at least partially overlap the second conductive line 1130.

A top surface of the pixel electrode 1150 may be formed along a profile of the top surface of the second insulating layer 1140 which is disposed under the pixel electrode 1150. For example, an upper and lower surface of the pixel electrode 1150 and an upper surface of the second insulating layer 1140 may be parallel and coplanar. The second insulating layer 1140 has the flat top surface, so that a protrusion may not be formed on the top surface of the pixel electrode 1150.

FIGS. 13, 14, 15, 16, and 17 are cross-sectional views illustrating steps in a method manufacturing the display device of FIG. 12. In the method of manufacturing the display device, which will be described with to FIGS. 13 to 17, descriptions of components substantially identical to the components of the method of manufacturing the display device previously described with reference to FIGS. 8 to 11 will be omitted.

Figure 13:
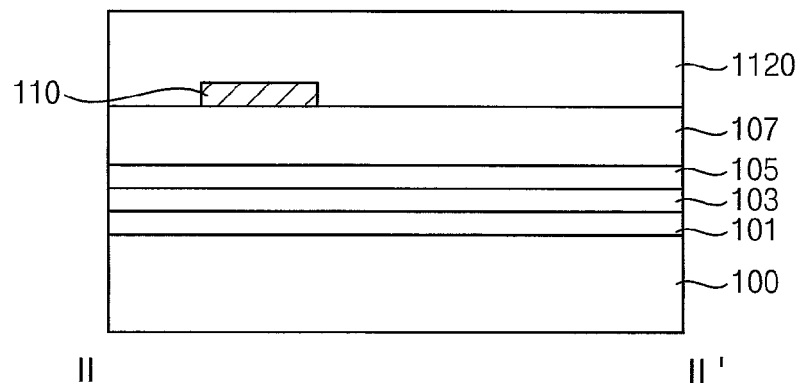
FIGS. 13, 14, 15, 16, and 17 are cross-sectional views illustrating steps in a method of manufacturing the display device of FIG. 12, according to an exemplary embodiment of the present invention.

Referring to FIG. 13, the first conductive line 110 may be formed on the substrate 100, and the first insulating layer 1120 which at least partially covers the first conductive line 110 may be formed on the substrate 100.

The first conductive line 110 may be formed on the second interlayer layer 107.

Next, the first insulating layer 1120 which at least partially covers the first conductive line 110 may be formed on the second interlayer insulating layer 107. In an exemplary embodiment of the present invention in which the first insulating layer 1120 includes an organic insulating material, the first insulating layer 1120 may be formed by applying an organic insulating material such as a photoresist onto the second interlayer insulating layer 107 on which the first conductive line 110 is formed. The formation of the first insulating layer 1120 may be performed by a process such as spin coating. In an exemplary embodiment of the present invention which the first insulating layer 1120 includes an inorganic insulating material, the first insulating layer 1120 may be formed by depositing an inorganic insulating material such as silicon oxide, silicon nitride and/or silicon oxynitride on the second interlayer insulating layer 107 on which the first conductive line 110 is formed. The first insulating layer 1120 may be formed by using a chemical vapor deposition process such as PECVD.

Figure 14:
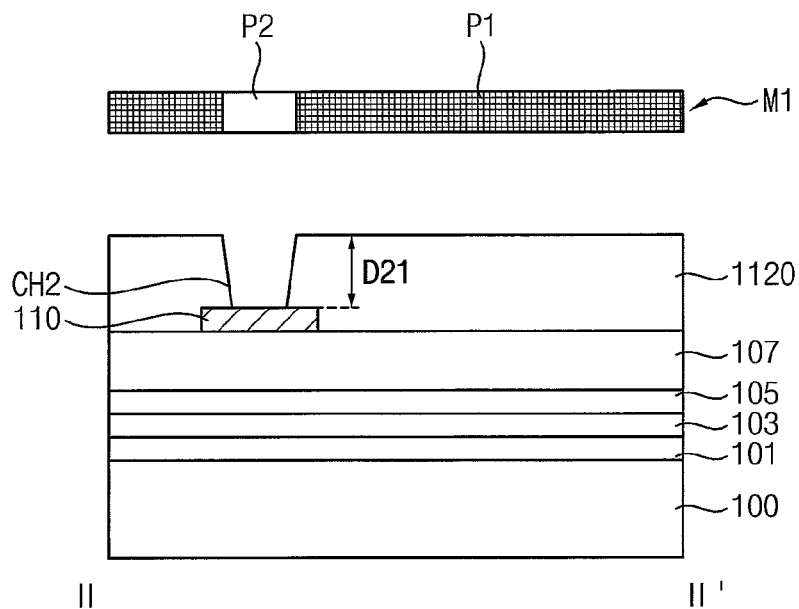

Referring to FIG. 14, the contact hole CH2 may be formed in the first insulating layer 1120. The contact hole CH2 may expose the first conductive line 110.

In an exemplary embodiment of the present invention, the contact hole CH2 may be formed by using a first mask M1. The first mask M1 may include a light blocking part P1 and a light transmitting part P2. The light blocking part P1 may block light, and the light transmitting part P2 may transmit the light.

In an exemplary embodiment of the present invention in which the first insulating layer 1120 includes an organic insulating material, the first mask M1 may be disposed on the first insulating layer 1120. The light transmitting part P2 may at least partially overlap an area in which the contact hole CH2 is formed. Next, the contact hole CH2 may be formed by exposing the first insulating layer 1120 to light by using the first mask M1, and developing the first insulating layer 1120 exposed to the light.

In an exemplary embodiment of the present invention in which the first insulating layer 1120 includes an inorganic insulating material, a first photoresist layer may be formed on the first insulating layer 1120. Next, the first mask M1 may be disposed on the first photoresist layer. The light transmitting part P2 may at least partially overlap an area in which the contact hole CH2 is formed. Thereafter, a first photoresist pattern may be formed by exposing the first photoresist layer to light by using the first mask M1, and developing the first photoresist layer exposed to the light. Then, the contact hole CH2 may be formed by etching the first insulating layer 1120 using the first photoresist pattern as an etching mask. Next, the first photoresist pattern may be stripped.

Figure 15:
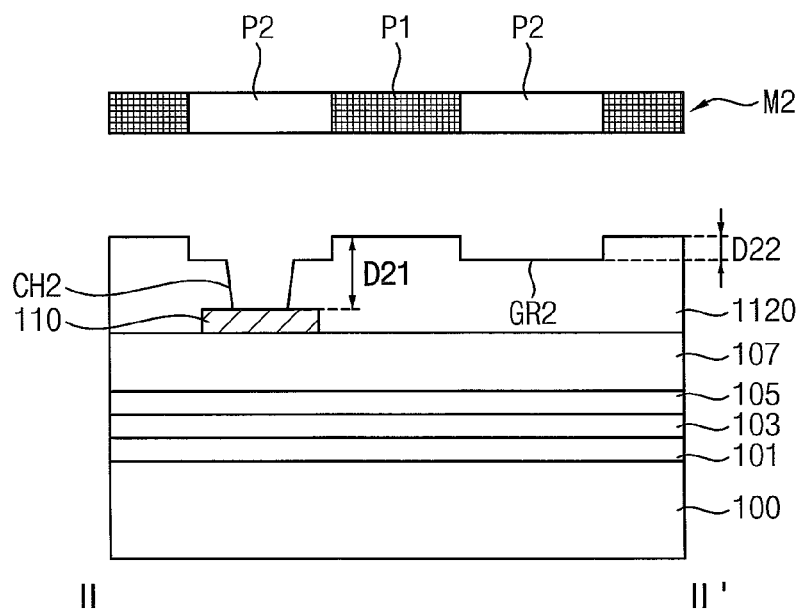

Referring to FIG. 15, the groove GR2 may be formed in the first insulating layer 1120. The groove GR2 may be recessed in the direction towards the substrate 100, and may have the depth D22 smaller than the depth D21 of the contact hole CH2.

In an exemplary embodiment of the present invention, the groove GR2 may be formed by using a second mask M2. The second mask M2 may include a light blocking part P1 and a light transmitting part P2. The light blocking part P1 may block light, and the light transmitting part P2 may transmit the light.

First, a second photoresist layer may be formed on the first insulating layer 1120. Next, the second mask M2 may be disposed on the second photoresist layer. The light transmitting part P2 may at least partially overlap an area in which the groove GR2 is formed. Thereafter, a second photoresist pattern may be formed by exposing the second photoresist layer to light by using the second mask M2, and developing the second photoresist layer exposed to the light. Then, the groove GR2 may be formed by etching the first insulating layer 1120 by using the second photoresist pattern as an etching mask. Next, the second photoresist pattern may be stripped.

In an exemplary embodiment of the present invention, the groove GR2 may be formed by anisotropically etching the first insulating layer 1120. For example, the insulating layer 1120 may be an isotropically etched in a process of etching the first insulating layer 1120 exposed by the second photoresist pattern through a dry etching scheme. In this case, the groove GR2 may have a rectangular shape recessed in the direction towards the substrate 100.

Figure 16:
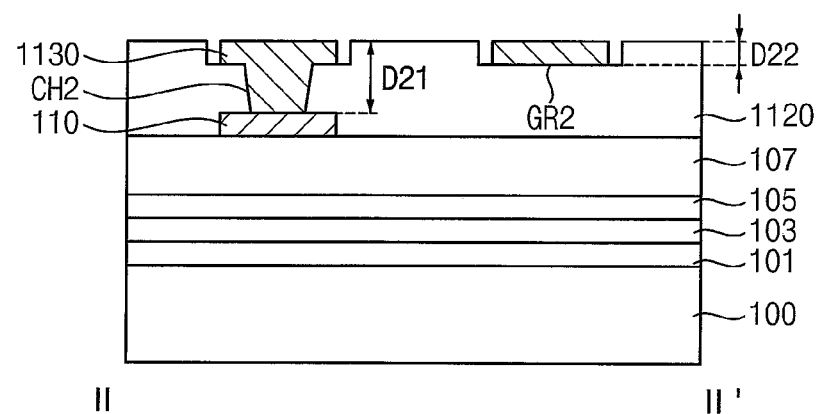

Referring to FIG. 16, the second conductive line 1130 which fills the contact hole CH2 may be formed in the groove GR2 on the first insulating layer 1120.

The second conductive line 1130 may be formed in the groove GR2 having a rectangular shape recessed in the direction towards the substrate 100. Accordingly, the second conductive line 1130 may have the flat top surface.

Figure 17:
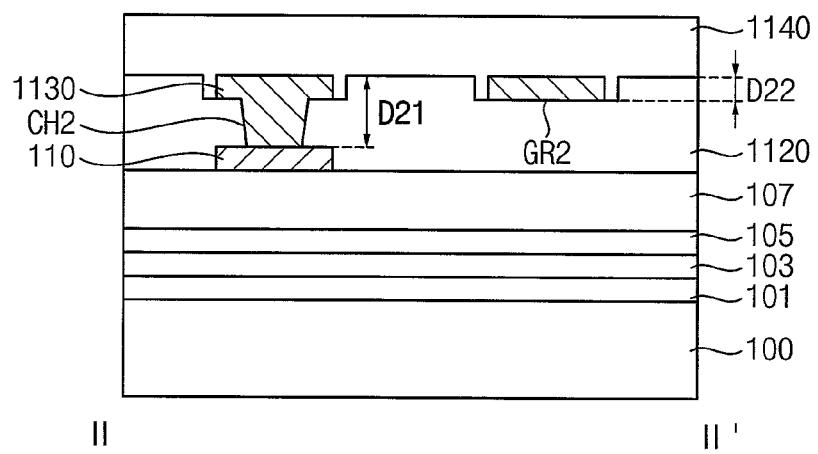

Referring to FIG. 17, the second insulating layer 1140 which at least partially covers the second conductive line 1130 may be formed on the first insulating layer 1120.

In the present exemplary embodiment of the present invention, the first insulating layer 1120 is anisotropically etched by using the second mask M2 to form the groove GR2 having a rectangular shape recessed in the direction towards the substrate 100, so that the second conductive line 1130 having the flat top surface may be formed. Accordingly, the second insulating layer 1140 having the flat top surface may be formed, and the visibility of the display device may be increased.

The display device according to the exemplary embodiments of the present invention may be applied to a display device included in a computer, a notebook, a mobile phone, a smartphone, a smart pad, a PMP, a PDA, MP3 player, or the like.

While exemplary embodiments of the present invention have been particularly shown and described above, it will be understood that various changes in form and details may be made therein without departing from the spirit and scope of the present invention.

What is claimed is:

1. A display device, comprising:
   a first conductive line disposed on a substrate;
   a first insulating layer disposed on the substrate at least partially covering the first conductive line, the first insulating layer having a contact hole, which exposes the first conductive line, and a groove recessed in a direction towards the substrate, the groove having a depth smaller than a depth of the contact hole; and
   a second conductive line disposed in the groove on the first insulating layer and connected to the first conductive line through the contact hole,
   wherein the first insulating layer has a bottom surface closer to the substrate and a top surface farther from the substrate, and
   wherein each of the groove and the contact hole extend from the top surface of the first insulating layer, towards the substrate.

2. The display device of claim 1, further comprising a second insulating layer disposed on the first insulating layer at least partially covering the second conductive line,
   wherein the groove has a round shape recessed in the direction towards the substrate.

3. The display device of claim 2, wherein the second conductive line has a 'U' shape.

4. The display device of claim 1, wherein the groove has a rectangular shape recessed in the direction towards the substrate.

5. The display device of claim 4, wherein the second conductive line has a flat top surface.

6. The display device of claim 1, wherein a maximum depth of the groove is substantially equal to a thickness of the second conductive line.

7. The display device of claim 1, wherein the first conductive line extends in a first direction and is configured to transmit a data signal.

8. The display device of claim 7, wherein the second conductive line extends in the first direction and a second direction intersecting the first direction, and
   wherein the second conductive line connects a pad to the first conductive line.

9. The display device of claim 1, wherein the first insulating layer includes an organic insulating material and an inorganic insulating material.

10. The display device of claim 2, wherein the second insulating layer includes an organic insulating material.

11. The display device of claim 2, further comprising:
    a pixel electrode disposed on the second insulating layer at least partially overlapping the second conductive line;
    a light emitting layer disposed on the pixel electrode; and
    a counter electrode disposed on the light emitting layer.

12. The display device of claim 11, wherein the pixel electrode is a reflective electrode, and
    wherein the counter electrode is a transmissive electrode.

13. The display device of claim 1, wherein the groove is spaced apart from the contact bole in a cross-sectional view.

* * * * *